United States Patent [19]

Godbecker

[11] Patent Number: 4,790,053

[45] Date of Patent: Dec. 13, 1988

[54] DEVICE FOR COUPLING AN ASSEMBLY TOOL, SUCH AS GRIPPER OR SIMILAR

[75] Inventor: Heinz Godbecker, Wustbach, Fed. Rep. of Germany

[73] Assignee: Sud Finanz S.A., Luxembourg, Luxembourg

[21] Appl. No.: 17,158

[22] Filed: Feb. 20, 1987

[30] Foreign Application Priority Data

Feb. 21, 1986 [DE] Fed. Rep. of Germany ....... 3605590
Feb. 10, 1987 [DE] Fed. Rep. of Germany ....... 3703993

[51] Int. Cl.$^4$ ............................................. B23B 39/20
[52] U.S. Cl. .......................................... 29/42; 29/39; 29/568; 29/739; 901/30; 901/37; 901/41
[58] Field of Search ...................... 29/35.5, 39, 40, 42, 29/739–741, 568; 901/30, 31, 34, 35, 37, 39, 41, 48

[56] References Cited

U.S. PATENT DOCUMENTS

| | | | |
|---|---|---|---|
| 3,259,958 | 7/1966 | Lemelson | 408/16 X |
| 4,197,638 | 4/1980 | Asai et al. | 29/741 |
| 4,290,178 | 9/1981 | Friese | 29/739 X |
| 4,520,550 | 6/1985 | Dunn et al. | 29/568 |
| 4,682,930 | 7/1987 | Hachisu | 901/48 X |
| 4,691,419 | 9/1987 | Keeler et al. | 901/30 X |

FOREIGN PATENT DOCUMENTS

| | | |
|---|---|---|
| 0094338 | 11/1983 | European Pat. Off. |
| 0140036 | 5/1985 | European Pat. Off. |
| 0156194 | 10/1985 | European Pat. Off. |
| CH655039 | 3/1986 | Switzerland |

*Primary Examiner*—Gil Weidenfeld
*Assistant Examiner*—Steven C. Bishop
*Attorney, Agent, or Firm*—Wood, Herron & Evans

[57] ABSTRACT

A device is disclosed for mounting a plurality of assembly tools such as grippers or the like on the end of a robot arm. The device includes a turret head for supporting a plurality of grippers and a turret head support member which is shiftably mounted relative on the end of the robot arm. The turret head is rotatable about an axis at an acute angle to the axis of the robot arm. Two angularly disposed pusher arms are carried by the turret support member and extend into a chamber in the turret head. A shaft extends from the end of the robot arm into an opening in the turret support member. A weight compensating member and a position sensor are mounted in the turret support member for cooperation with the shaft.

12 Claims, 7 Drawing Sheets

DEVICE FOR COUPLING AN ASSEMBLY TOOL, SUCH AS GRIPPER OR SIMILAR

BACKGROUND OF THE INVENTION

The present invention concerns a device for mounting an assembly tool such as a gripper or similar device to the end of a robot arm. More particularly, the present invention is concerned with a turret construction for mounting a plurality of such grippers or other assembly tools upon the end of a robot arm, the turret head being rotatable so as to selectively position any of a plurality of grippers for engagement with a work piece.

The problem underlying the invention is to provide a turret which is effective to rapidly position one of a plurality of assembly tools in position to engage a work piece and which is effective to coordinate the operation of the assembly tool with other devices, the turret having a simple rugged, compact and space saving design.

SUMMARY OF THE INVENTION

In accordance with the present invention this problem is solved by providing a turret adapted to be mounted on the end of a robot arm which turret comprises a turret head support member having a socket for receiving the end of the robot arm, a turret head mounted for rotation upon an axis extending at an acute angle relative to the axis of the robot arm, a setting motor for rotating the turret head, a locking device for holding the turret head in any of a selected number of positions. The turret head includes a plurality of openings for receiving assembly tools and a large central chamber receiving two converging, fluid actuated push rods which are disposed to engage the rear face of the assembly tool disposed in an operative position.

The present invention further contemplates a turret head which is mounted on the robot arm in such a manner that it can be shifted longitudinally along the axis of the robot arm. A shaft mounted on the robot arm extends into an opening in the turret head support. A scanner is mounted in this opening to sense relative movement of the turret head support and robot arm to provide an electrical signal for shutting off the apparatus in the event that the turret or a tool carried thereby engages an obstruction.

In another aspect of the present invention the turret head support extends downwardly from the end of the robot arm and the shaft mounted to the robot arm which extends into an opening in the turret head support carries a piston head of a weight compensating device which substantially reduces the force necessary to shift the turret relative to the robot arm.

As a result of such design, a turret for mounting assembly tools on the end of a robot arm of increased utility is obtained: Its advantage lies especially in keeping several assembly tools ready at a central location of the robot arm end. An assembly tool change can be performed immediately in the course of the internal program control, that is, without regress to a magazine. Owing to the rotationally symmetric design of the turret head, idle times are limited to fractions of seconds. The coupling with the robot arm can be realized quickly, safely and in a stable fashion. The turret head support features for that purpose an insertion opening for the robot arm end. The spatial distribution is optimal as well, with the axis of rotation of the turret head extending at an acute angle relative to the axis of insertion. The setting motor causing the turret head motion extends along the axis of rotation of the turret head. The applicable angular position is defined by a turret head locking device. An assembly tool coordination favorable especially in terms of load and leverage is additionally accomplished in that the assembly tool holder which is moved in working condition is in a coaxial position relative to the axis of insertion. The other assembly tool holders assume thereby also an appropriate axially congruent position in the course of the turret head motion. The correspondingly favorable constellation of the components which are rotatable relative to one another and form the turret head permits a rather compact design and results also in a low weight of the device. In this context, a favorable design results from the fact that the extensions of the insertion opening axis, the rotary axis of the turret head, and all assembly tool holder axes intersect in one point. This intersection lies suitably in the center of the turret head, thus reserving the "back of the head" in a clear arrangement for the drive and support elements while the "face" comprises the spatially most favorably adjacent tool holders. A favorable design, moreover, is given through a slipping clutch before the turret head, avoiding excessive stresses. Also, it proves to be favorable that a coding disk scanning the turret head position is arranged in the area of the rotary joint between the turret head support and the turret head. The entire arrangement interacts with a program computer. Concretely, the turret head locking device is formed by a locking bolt which is controlled by a pressure medium and which, sitting in the turret head support and crossing the rotary joint, engages the coding disk, which is provided with corresponding recesses. The scanning of the coding disk is performed by proximity sensors which interact with iron cores and transmit the selected position in the form of feedback to a monitoring center. Moreover, it proves to be advantageous that the axis of rotation of the turret head assumes a 45° position relative to the insertion opening axis. This enables a spatially favorable distribution of the driving and holding means in a relatively small support. The operating medium, for instance compressed air, is admitted in the area of the insertion opening from a central compressed air supply. This eliminates exposed supply lines. Gripper and tool are powered by at least two pushrods which are provided in the turret head support, are arranged at an acute angle and symmetric to the insertion opening axis while converging toward the turret head, and can be operated by a pressure medium, the holder opening of which pushrods, on the rotary joint end, being in any rotary position of the turret head in coaxial alignment with a run-in space of the turret head, which run-in space connects with the assembly tool holders fashioned as insertion cavities. Additionally, the invention suggests that the intersection of the converging pushrods be situated in the extension of the insertion opening axis. This produces drive and actuating conditions of equal rank for all assembly tools controlled through this intersection, since the axis of rotation of the turret head crosses the run-in space centrally. The intersection lies below the axis of rotation of the turret head. The imaginary plane of the pushrod axes thus intersects this axis of rotation. In summary, it should thus be noted that such a device is spatially optimally divided as a robot multifunction hand and, especially, is of a very compact design. The program-controlled tool, for instance a gripper, moves as a consequence of the rotationally symmetric design of the turret head in only fractions of seconds of idle time in the assigned position, with a linear path of force existing due to the coaxiality of robot arm insert opening axis and assembly tool holder. This, and especially the minimal control times, may in the event of colliding with an obstacle lead to expensive damage. Therefore it is suitable to give the multifunction hand of the robot a more sensitive design, that is, advancing the device in such a way that its operational safety will be increased and that it will react immediately to interferences, such as specifically loads which are inconsistent with the program. To that end it is suggested to support the turret head on the robot arm so as to be longitudinally shiftable in the direction of the insertion opening axis while floating freely.

Such design increases the utility and safety value: The free floating situated directly in the direction of force permits an escape in the event of gripper contact in variation from the program. This takes place practically in a braking fashion, sparing the highly sensitive tool. The relative motion of turret head and robot arm can additionally be utilized in a safety-promoting way in that the free floating displacement realized between the turret head and the robot arm is suitably scanned electrically. The resulting pulse is utilized, by way of a control system, for the immediate shutoff of the apparatus, and at that, in the sense of ON, OFF (and thus also for a new attempt). Avoiding a coarse crash, this design comprises constructionally a further measure to the effect that the longitudinal guidance is realized by a bushing in the turret head support and a shaft running in it coaxially. To realize here at the same time a rotary protection which can be overrun in the event of coarse interferences, the invention additionally suggests that the shaft be provided on its outer cylindrical surface with several longitudinal slots which interact with roll members of the bushing which are radially prestressed inwardly. Thus, if the turret head collides in the sense of an elevated torque, the roll elements will elastically give; the defined position can be reset exactly upon removal of the obstacle. If the longitudinal slots extend at an even angular distribution, this offers the possibility to give the turret head support various angular home positions. A favorable advancement consists in a weight-compensating device for the turret head and its support, which device is formed by a piston/cylinder unit. With a head weight of for instance 1.5 kg it is possible to ensure, by means of a pneumatic constant counterpressure that only a load of 0.5 kg needs to be overcome. This makes the turret head more sensitive. In detail, the weight-compensating device is so designed that the piston of the piston/cylinder unit is attached to the robot arm by means of its piston rod extending in the direction of the insertion opening axis while the cylinder is fashioned on the cylinder head support. For introducing the pneumatic pressure cushion it proves to be favorable that an axial channel extends through the piston rod for feeding the pressure medium to the piston/cylinder unit. The feeding can be realized, and varied, correspondingly favorably through a feeding channel of the arm. Regarding the scanning of the relative movement between turret head support and robot arm, a suitable procedure provides for recording the free floating stroke by a capturing device and transmitting it to a control device of the arm. The capturing device is favorably designed as an inductive or capacitive distance scanning and is formed by a sensor which is located in the path of the piston. The classic microswitches are suitable already in specific cases. As already explained above, the gripper or tool is driven by the two pushrods which are provided in the turret head support, extend at an acute angle and symmetric to the insertion opening axis while coverging on the turret head side, and can be actuated by a pressure medium. For instance, the one pushrod controls a gripper; the other, also called pusher, actuates a presser or pressing finger, respectively. The purposes of these components are explained in greater detail in describing the embodiment. Advantageous is also that at least one of the pushrods is provided with a pushrod position recognizing device. The latter is formed using an induction coil in which a core connected with the pushrod is contained in a longitudinally shiftable manner. Such devices are highly sensitive. The recognition is in the range of tenths of millimeters. The tuning for generation of a signal may be such that the tool loading function will be stopped or a new attempt initiated, respectively, when the overall stroke provided for by the program is not performed completely.

Further details of the inventional object are more fully explained hereafter with the aid of an embodiment illustrated in the drawings.

DESCRIPTION OF A PREFERRED EMBODIMENT

Sitting on the arm end 1 of a robot arm featuring several knuckle joints, the device features a turret head support 2 with a turret head 3 mounted on it rotatably.

The turret head support 2 features in the area of a molded socket 4 a cylindrical insertion opening 5 for attachment of said end 1. Sort of a clamp is realized through a longitudinal slot 6 which is provided across a partial length of the socket. Originating from the longitudinal slot area are two parallel jaws 7 which extend essentially radially outward and can be tightened onto one another under reduction of the opening width by a screw 8 which passes through them transversely. The insertion opening is a blind bore.

Additionally, the turret head support 2 is hollowed out or channeled, respectively. The respective cylindrical recess 9 accommodates a setting motor 10, which may be an electric gear motor. According to FIG. 2, said motor is seated in a bushing 11 which, extending not quite to the bottom of the recess 9, is formed on the opposite end of an annular flange 12. Extending through said flange, retaining screws 13 cause the bushing 11 to bear firmly on the turret head support 2.

Pointing in the direction of the turret head 3, the take-off shaft 14 of the setting motor 10 passes through a central opening in the bottom of the cupshaped bushing 11. The take-off shaft 14 is detachably connected with an intermediate shaft 15, which connects via a knuckle joint 16 with a coaxial follow-on shaft 17. The sliding clutch 18 is located in front of the flat front face 3' of the turret head 3 and extends with an end section into a concentric recess 19 of the turret head 3. The sliding clutch 18 can be adjusted to the desired braking effect by means of the facility 20.

Figure 5:
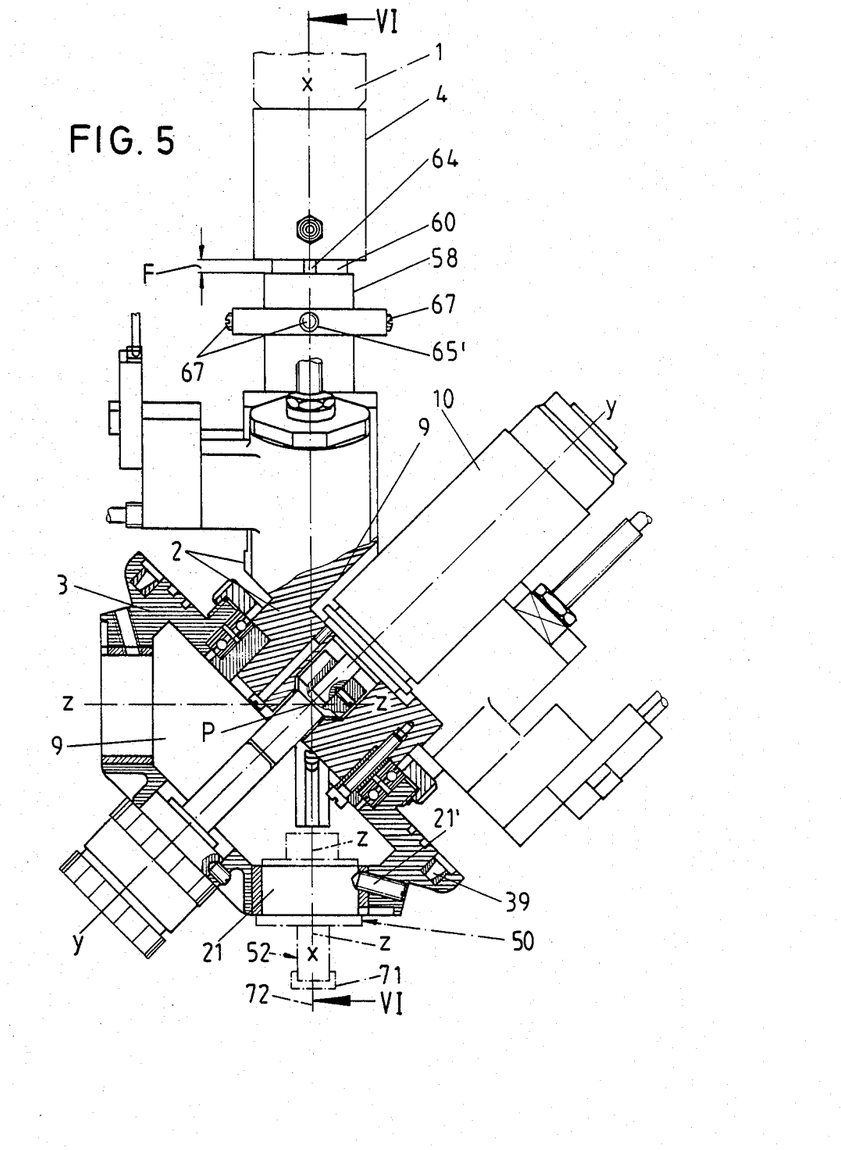
FIG. 5, the inventional device, partly cut away, on the end of a robot arm.

According to FIG. 5 screw-mounted in an unlined recess, the setting motor 10 serves to rotate the turret head 3, which features a number of holders 21 for not illustrated assembly tools etc., into its desired working position. The respective operationally consistent working position is then defined by a stop.

Figure 1:
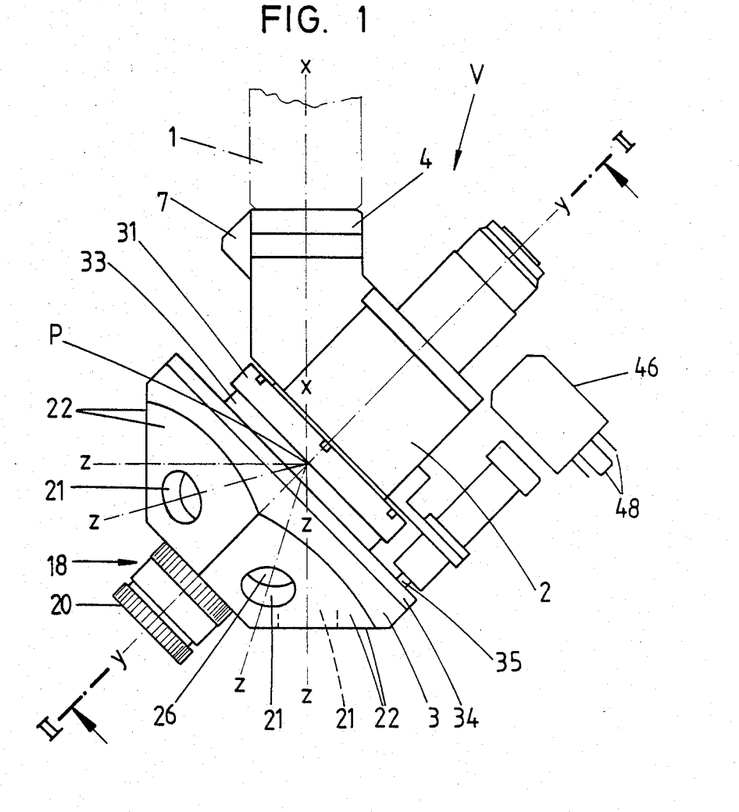
FIG. 1 shows the turret head in extensively schematic presentation, sitting on the end of a robot arm.

In order to obtain with a maximum number of assembly tool holders 21 nevertheless a spatially favorable working position, the insertion opening axis x—x extends at an acute angle $\alpha$ of 45° relative to the axis of rotation y—y of the turret head (FIG. 1).

Viewed in terms of rotation, the assembly tool holders 21 have a mutually even angular spacing. A total of six such holders 21 are provided on the turret head 3, originating from a corresponding number of facets 22 of the turret head 3. The arrangement of the facets can be seen from FIG. 1.

Figure 2:
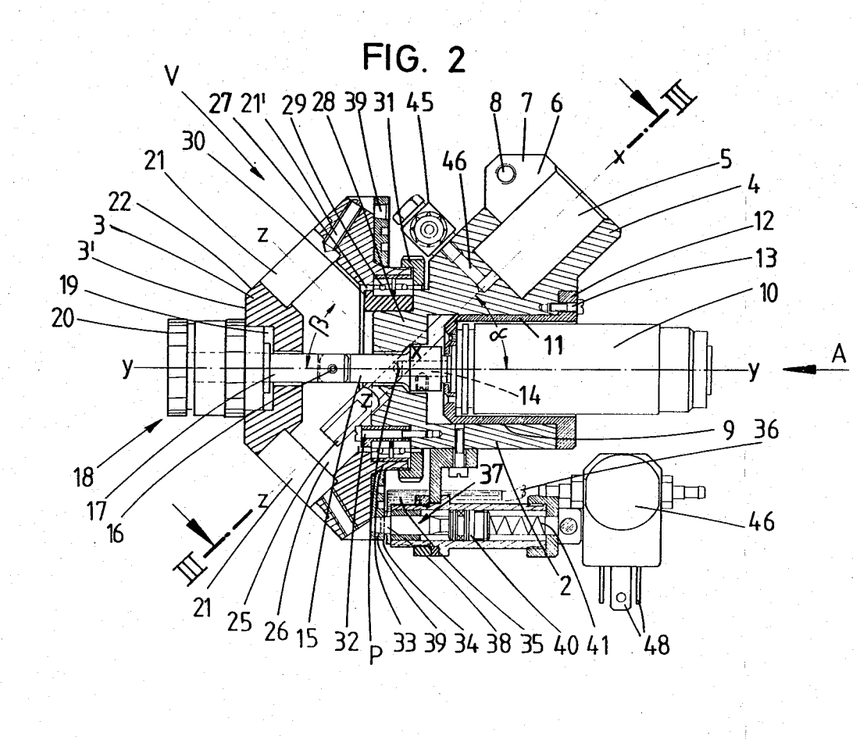
FIG. 2, a section along line II—II in FIG. 1.

As can be seen from FIG. 2, the extensions of the assembly tool holder axes z—z extend on the support side as well at an acute angle to the axis of rotation y—y of the turret head. Underlying here, too, is an angle $\beta$ of 45°. Overall, an axes constellation is thus given to an effect such that the extension of the insertion opening axis x—x, the extension of the axis of rotation y—y of the turret head, and the extensions of the assembly tool holder axes z—z intersect all in a common point P. This point lies practically in the center of the robot head 3.

Consequently, one of the six assembly tool holders 21 is always in a position coaxial with the insertion opening axis x—x, that is, with its extension.

The operationally consistent working position is governed by pushrods 24, 25 actuating the assembly tool or similar. The pushrods are actuated by a pressure medium. They extend through the turret head support 2 at an acute angle, converging in the direction of the turret head 3. Situated in the interior of the angle is the section of the support 2 which forms the insertion opening 5. The take-off and the intermediate shafts 14, 15 intersect near the apex. The acute angle position relative to the insertion opening axis x—x which is selected here as well follows from FIG. 3. On the other hand, the angular plane or position of inclination, respectively, coincides with the angle $\alpha$. Intersecting in terms of planes the point P, the intersection P1 of the converging pushrods 24, 25 is situated in the extension of the insertion opening axis x—x, but spatially distinctly below the axis of rotation of the turret head y—y extending horizontally in FIG. 2.

Extending in this area of the intersection P1 is also the back of assembly tools 50 which are illustrated in detail in FIGS. 5 through 8. Allowing for the position of the heads of the pushrods 24, 25 installed each in the area of a holder opening of the support 2 and protruding freely from the turret head support 2, the center of the turret head 3 is machined so as to have a relatively large volume, producing a run-in space 26 which will not interfere with the rotary motion of the turret head 3. This run-in space 26 connects with the holders 21 which are fashioned as cylindrical insertion holes for the assembly tools. Radially aligned setscrews 21' serve to fix the assembly tool foot inserted in the holder.

Extending rearward from the run-in space 26 is a central bearing hollow 27 (compare FIG. 2). Extending into it, from the free end, is an as well cylindrical socket 28 of the turret head support 2. Situated in between, arranged in pairs, are ball bearing rings 29 whose position is secured on both ends by retaining rings 30, 31. The retaining ring 30 coordinated from the turret head end obtains its fixation through retaining screws 32 which are installed in the turret head support 2. The other, external retaining ring 31 is designed as a threaded ring. Its mating threading is contained on a collar 33 of the turret head 3 which on the periphery extends axially across the ball bearing rings 29.

A coding disk 34 is slipped on the collar 33 and attached by means which are not illustrated in detail. The coding disk 34 extends up to the circumferential rim of the turret head 3 and, in the area of the rotary joint, between the turret head support 2 and the turret head 3. The coding disk scans the respective rotary position of the turret head. To that end it interacts with a proximity sensor 35 which through a line 36 connects with a central control center.

Additionally, the coding disk 34 interacts with a turret head locking device 37. An integral part of it is a locking bolt 38. It is seated, spring-loaded, in a bolt recess 39. Such a bolt recess 39 is coordinated with each of the six holders 21 which are distributed on a multifaceted truncated pyramid. The plunger-type locking bolt 39 extends on the far side from the turret head 3 into a control piston 40. This is followed, on its free piston shaft, by a helical compression spring 41 which on the free end finds its support-side bearing. Admitting a pressure medium which pressurizes the end of the control piston 40 on the turret head side causes the release, and the next tool is subsequently advanced by the setting motor 10 into the selected operationally ready position, that is, in the coaxial position relative to the insertion opening axis x—x.

The two pushrods 24, 25 are controlled as well by pressure medium. For that purpose, the pushrods are provided on their outward shaft ends pointing away from the turret head 3 with a control piston 42 each which runs in a cylindrical bore of the turret head support 2. The pressurization occurs there from the side away from the turret head 3 while a helical compression spring 43 causes the return in the retracted home position. Arranged behind the pistons 42 are pressure connections 44 which are supplied through an annular connection which is not illustrated in detail. The pressure medium supply is centralized, and at that, taking place in the area of the insertion opening 5. Beginning here is the line 46, which originates from the bottom of the insertion opening 5 and runs to the main connection 45. The arm itself contains internally the supply line, which is not shown in detail here. The connection intended for the turret head locking device 37 is marked 46 and located on a console 47 connecting it with the support 2. All of the compressed air valves feature plugs 48 for electrical control lines.

Located before the pushrod ends on the turret head side, in reachable vicinity, are the actuating end 51 of a gripper 52 and the free end 53 of a pressure finger 54 of the assembly tool 50.

Figure 6:
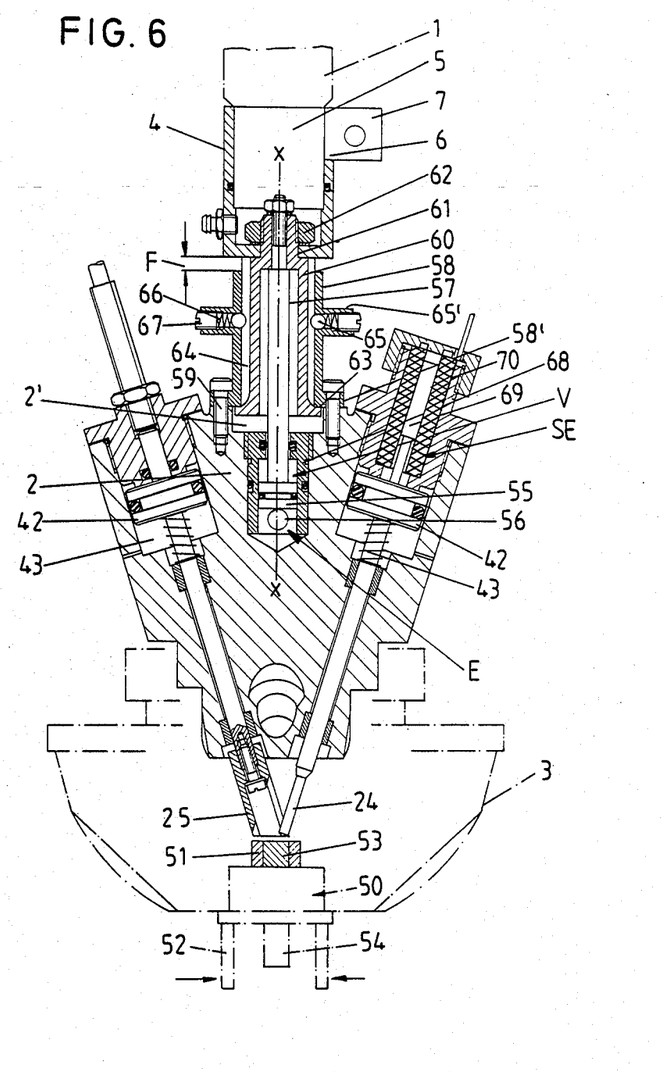
FIG. 6, a section along line VI—VI, in FIG. 1.
Figure 7:
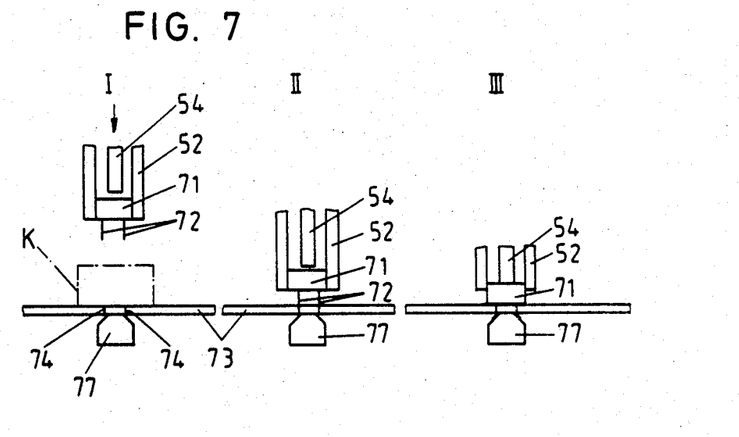
FIG. 7, the motion study of a tool loading operation proceeding normally and, shown by broken lines, a cause of interference where the coarse sensor responds in the free floating range.
Figure 8:
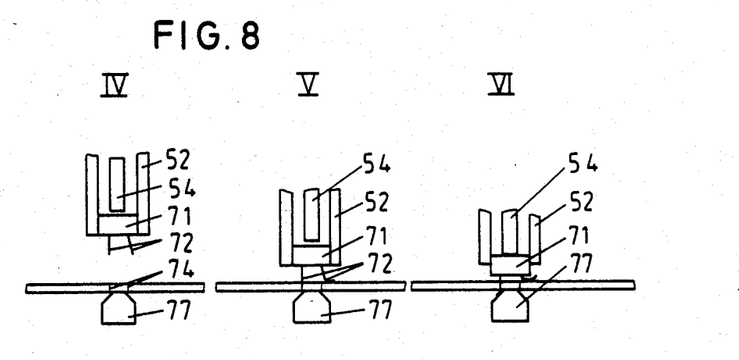
FIG. 8, a case of interference during tool loading, in which case the interference reason is registered by induction and converted to a preventive measure.

The jaws of the gripper 52 are held open by the force of a spring which is accommodated in the tool 50. Similarly, a not illustrated spring prestresses the pressure finger 54 in the direction of its home position (FIG. 6).

The device is equipped with a damage protection which causes the immediate shutdown of the robot hand as soon as the turret head 3 senses a greater resistance. To translate such into an evading or relative movement, respectively, the turret head 3 is mounted on the robot arm so as to be longitudinally shiftable in the direction of the insertion opening axis x—x of the arm end 1 under formation of a free floating F, and at that, between the turret head 2 and the robot arm 1. When the vertically descending assembly tool 50, inconsistent with the program, strikes for instance a body K (FIG. 7), the turret head 3 yields accordingly. This process is utilized for the electrical path scanning, in that the free floating stroke is registered by a capturing device E and relayed to a control device of the robot arm 1. Regarding the capturing device, this may be one of an inductive or capacitive type. The embodiment prefers a sensor 56 which is located in the path of a piston 55. Acting like a scanning finger, this piston 55 extends in the yielding direction of the turret head 3 in a piston shaft 57 which is permanently connected with the holder of the arm end 1 formed by the socket 4. In the embodiment, this is a screw connection. In the operationally ready position shown in FIG. 6, the piston face plane on the turret head side extends along the upper edge of the sensor (initiator 56). With increasing yielding, the sensor face shifts into the cylindrical wall area of said piston 55.

The guidance in shifting is assumed by a bushing 58, which is attached to the back of the support 2. It features for that purpose on the carrier side an annular flange 58' for the mounting screws 59. Insofar, the bushing 58 is a functional component of the turret head support 2. Extending coaxially with the arm end 1, a shaft 60 runs in the bushing 58. This shaft is screw-connected with the cup-shaped socket 4 that forms the insertion opening 5. The cup bottom of the socket 4 features for that purpose a central bore 61 through which protrudes an offset section of the shaft 60, whose cylindrical surface is threaded there for mating with a nut 62. The piston shaft 50 protrudes beyond the offset section of the shaft 60 and is threaded as well for mating with a mounting nut.

The end of the shaft 60 on the turret head side forms additionally an outward ring-shaped support shoulder 63. Suspended on it is the entire turret head support 2, in that the support shoulder 63 extends over and around the front end of the bushing 58, on its edge. The turret head support 2 is for that purpose appropriately recessed radially and has a depth which corresponds to the free floating reference between the free bushing rim and the underside of the cup, in axial direction. The space-forming recess is marked 2'.

The shaft 60 features on its cylindrical surface several longitudinal slots 64. A total of four such longitudinal slots, angularly evenly distributed, are provided and engaged by a roll element 65. Concerned are balls which are accommodated in radial chambers 65' of the bushing 58. They are stressed by a helical compression spring 66 which forces them on the flanks of the longitudinal slots having the form of V-kerfs. The spring force is adjustable by rearward setscrews 67 forming the outer spring bearing and having an outwardly directed tool-engaging point. Forced turning of the turret head support 2 on the shaft 60 causes the roll elements 65 to yield, so that loads on the support 2 which are inconsistent with the program cannot lead to a destruction. Owing to the equal angular spacing of the longitudinal slots 64, the turret head support 2 also can be moved in several home positions.

To relieve the turret head 3 so that in a shift under reduction of the free floating F not the entire weight comprised of carrier 2, turret head 3, assembly tool 50 etc. must be lifted—which for instance may lead to the destruction of the part to be assembled—a weight-compensation device V is incorporated in the turret head support. It consists of a piston/cylinder unit, where the previously explained piston 55 can be used also for this unit. The pertaining cylinder is marked 68. Concerned is a cup-shaped basic body which by way of a screw connection is coordinated with the turret head support 2. The cup bottom features a central opening for the piston shaft 57 passing through outwardly in the center. The joint areas are sealed. The space situated between the piston back and the cup bottom contains air as a pressure medium. The pressure is exactly adjustable or changeable, respectively, in adaptation to the various weights which occur in outfitting the turret head 3 with tools. The feeding of the pressure medium for the piston/cylinder unit 55/68 is handled suitably under utilization of the piston rod 57 as a tubular line, in that it is centrally bored and connects with the pressure space through a transverse channel (not illustrated in detail).

In addition to the explained coarse sensor for the ON/OFF function or for performing another work attempt, a fine scanning is allowed for, and at that, with regard to the pushrod 24 operating as a so-called pusher. It serves the indication of scrap. The corresponding pushrod position recognizing device is marked SE. It operates inductively. To that end, the shaft extends into a core 69 which on the far side of the turret head protrudes beyond the piston 42. This iron core is accommodated in the central hollow of an induction coil 70. The pushrod 24 is in terms of stroke tuned to a maximum path, depending on the present program step. If this path is not fully negotiated or is negotiated, respectively, but at a robot arm coordinate which varies from the program, this means that the pressure finger 54 encounters an obstacle, for instance due to an incorrect outfitting.

Figure 3:
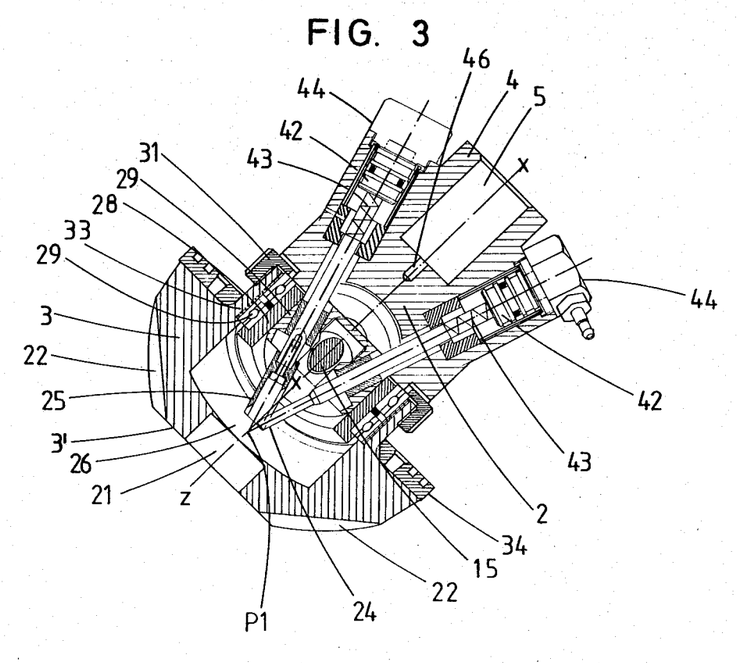
FIG. 3, a section along line III—III, in FIG. 2.

The mode of operation will be explained hereafter, specifically with the aid of FIGS. 3 and 4:

The turret head 3 has withdrawn from a magazine not illustrated in detail, for instance in accordance with its assembly tool number, six electronic components 71. Each gripper 52 of the assembly tool 50 holds on to the respective component and moves it in accordance with the program step into the assembly position I according to FIG. 3. The electronic component 71 possesses two parallel, equally long insertion feet 72, so-called pins. The apparatus descends toward the horizontal board 73 which at points coinciding with the pins 72 features paired openings 74. The pins are inserted in an order of tenths of millimeters; compare assembly position II. Once this position has been reached, the pusher (pushrod 24) forces the pressure finger down, prompted by the pressure medium. This occurs in the assembly position III. In the process, the gripper jaws may already be spread in a cupping way, releasing the electronic component 71, or they may continue to serve as a guide, as preferred here. The pressure finger 54 causes the residual vertical movement of the electronic component 71. A spreader block 75 positioned exactly on the back of the board 73 causes the pins 72 to be bent over on the back of the board, through bevels, so as to secure the electronic component 71 against dropping out (compare position III in FIG. 3).

If the apparatus recognizes in this normal sequence an obstacle, for instance a previously placed body K (compare FIG. 3, position I), the turret head support 2 shifts at a point inconsistent with the program inward relative to the arm end (free floating F) and the sensor 56 interrupts the assembly function immediately. Thus, damage to the tools or turret head, respectively, will not occur. The pushrod 24 will not even begin its function.

Figure 4:
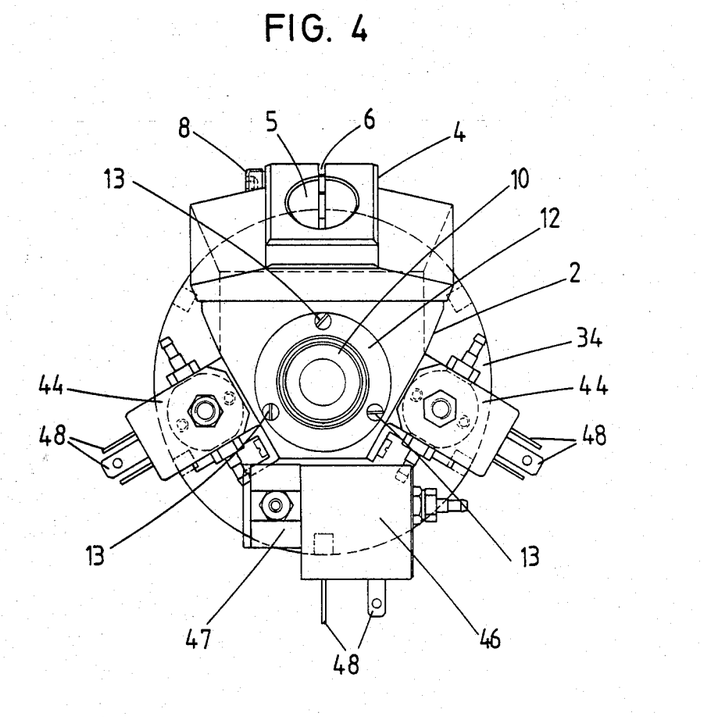
FIG. 4, a view in the direction of arrow A in FIG. 2.

The respective scrap function derives from the motion study according to FIG. 4: There, for instance, the gripped electronic component 71 is not ready for assembly because one if its pins 72 is no longer parallel. This situation is on hand in position IV. As the turret head now descends, the provisional insert connection relative to the board 73 (assembly position V) explained in conjunction with position II takes place. The one pin 72 will facultatively roll somewhat out but will generally not bring on a situation which is comparable with a coarse crash, so that the pushrod 24 now descends under program control. But the pin which remained on the top side of the board prevents the pushrod 24 from completely negotiating its programmed axial travel. By way of of the pushrod position recognizing device SE it is now possible to initiate the function by which the gripper 52 removes the improperly placed electronic component 71 again and drops it into a scrap chute. Additional functions may be programmed to an effect such that the gripper 52 picks up a new electronic component 71 or that simply the next gripper 52 of the turret head assumes the proper outfitting.

The actuation of the pushrod 24 in the stroke length provided for by the program may also translate into a response to the effect that the turret head is thereby shifted forward relative to the robot arm, in variation from the program control (free floating F), bringing about a shutdown of the apparatus or a new assembly attempt, respectively.

From the forgoing description of the general principles of the present invention and the above disclosure of a preferred embodiment, those skilled in the art will readily comprehend various modifications to which the invention is susceptible. Therefore, I desire to be limited only by the scope of the following claims.

Having described my invention, I claim:

1. A device for mounting an assembly tool to the end of a robot arm, said device comprising:
   a turret head;
   a turret head support member, said turret head support member including a socket for receiving said end of said robot arm;
   means rotatably supporting said turret from said turret head support member for rotation about an axis extending at an acute angle relative to said robot arm;
   a setting motor for rotating said turret head;
   locking means for locking said turret head in any of several positions relative to said turret head support member;
   said turret head further comprising a plurality of openings for receiving a plurality of assembly tools;
   one of said assembly tools being disposed in an operative position coaxial with the axis of said robot arm when said turret head is locked to said turret head support member;
   said turret head having an enlarged central chamber;
   two push rods mounted on said turret support member and extending into said chamber;
   said push rods being disposed on axes angulated with respect to one another and converging adjacent to an assembly tool mounted disposed in said operative position;
   and fluid pressure means for selectively actuating said rods.

2. The device of claim 1 further comprising means including a shaft interconnecting said setting motor and turret head, the said axes of said push rods converging on the side of said shaft remote from said robot arm.

3. The device of claim 2 in which said axes of said push rods extend at acute angles to said axis of said robot arm and are symetrically disposed relative thereto.

4. The device of claim 2 in which said axes of said push rods intersect one another on the axis of said robot arm.

5. A device for mounting an assembly tool to the end of a robot arm, said device comprising:
   a turret head;
   a turret head support member;
   said turret head support member having a socket for receiving said end of said robot arm;
   means rotatably supporting said turret head from said turret head support member for rotation about an axis extending at an acute angle relative to said robot arm;
   a setting motor for rotating said turret head;
   locking means for locking said turret head in any of several positions relative to said turret head support member;
   said turret head further comprising the plurality of openings for receiving a plurality of assembly tools;
   one of said assembly tools being disposed in an operative position coaxial with the axis of said robot arm when said turret head is locked to said turret head support member;
   means mounting said turret head support member on said robot arm for longitudinal shifting movement along the axis of said robot arm;
   said turret head support member having a bore formed therein;
   a shaft extending coaxially with said robot arm;
   a portion of said shaft being disposed within said bore;
   sensing means for sensing relative movement of said turret head support member relative to said portion of said shaft disposed within said bore.

6. The device of claim 5 in which said turret head support member extends downwardly from said robot arm, and said turret support member carries weight compensating means cooperating with said shaft for reducing the force required to shift said turret head support member relative to said robot arm.

7. The device of claim 6 in which said shaft carries a piston, a cylinder disposed within said opening, and means for introducing a pressurized fluid into said cylinder on the side of said piston adjacent to said robot arm.

8. The device of claim 4 in which a bushing is mounted on said turret head support member and a second shaft is secured to said robot arm, said second shaft being disposed in engagement with said bushing.

9. The device of claim 6 in which said second shaft is provided with a plurality of longitudinal slots on its surface and a plurality of roller members are carried by said bushing, said roller members being spring-urged inwardly.

10. The device of claim 5 in which said sensing device is mounted below said piston.

11. The device of claim 1 which further comprises a push rod position sensing device for sensing the position of one of said push rods.

12. The device of claim 11 in which said sensing device comprises an induction coil and a cooperating core, said cooperating core being mounted in a longitudinally shiftable manner for movement with one of said push rods.

* * * * *

UNITED STATES PATENT AND TRADEMARK OFFICE
CERTIFICATE OF CORRECTION

PATENT NO. : 4,790,053
DATED : December 13, 1988
INVENTOR(S) : Heinz Goldbecker

It is certified that error appears in the above-identified patent and that said Letters Patent is hereby corrected as shown below:

On the Title Page, Item [19], "Godbecker" should read --Goldbecker-- and
    Item [75], the name of the inventor, "Godbecker" should be
-- Goldbecker --.

Signed and Sealed this

Sixteenth Day of May, 1989

Attest:

DONALD J. QUIGG

*Attesting Officer*          *Commissioner of Patents and Trademarks*